United States Patent
Coudert et al.

(10) Patent No.: US 12,293,139 B1
(45) Date of Patent: May 6, 2025

(54) PARTITIONING A CIRCUIT FOR DISTRIBUTED BALANCED INDEPENDENT SIMULATION JOBS WITH UPPER-BOUNDED MEMORY

(71) Applicant: SYNOPSYS, INC., Sunnyvale, CA (US)

(72) Inventors: Olivier Coudert, Sunnyvale, CA (US); Tien-Chien Lee, Sunnyvale, CA (US); Songra Pan, Sunnyvale, CA (US); Suman Nandan, Milpitas, CA (US)

(73) Assignee: SYNOPSYS, INC., Sunnyvale, CA (US)

(*) Notice: Subject to any disclaimer, the term of this patent is extended or adjusted under 35 U.S.C. 154(b) by 406 days.

(21) Appl. No.: 17/879,571

(22) Filed: Aug. 2, 2022

Related U.S. Application Data

(60) Provisional application No. 63/228,355, filed on Aug. 2, 2021.

(51) Int. Cl.
  *G06F 30/31* (2020.01)
  *G06F 30/33* (2020.01)
  *G06F 30/367* (2020.01)
  *G06F 30/392* (2020.01)

(52) U.S. Cl.
  CPC .............. *G06F 30/31* (2020.01); *G06F 30/33* (2020.01); *G06F 30/367* (2020.01); *G06F 30/392* (2020.01)

(58) Field of Classification Search
  CPC ........................................................ G06F 30/31
  USPC ........................................................ 716/102
  See application file for complete search history.

(56) References Cited

FOREIGN PATENT DOCUMENTS

CN        112883671 A  *  6/2021

* cited by examiner

*Primary Examiner* — Eric D Lee
(74) *Attorney, Agent, or Firm* — Womble Bond Dickinson (US) LLP

(57) ABSTRACT

Disclosed herein are system, method, and computer program product embodiments for partitioning large circuits into balanced portions for independent simulation. Embodiments include generating a reduced graph by removing a plurality of startpoint vertices from a graph corresponding to a circuit. A plurality of small weakly connected components (SWCCs) and a plurality of large weakly connected components (LWCCs) corresponding to the reduced graph are computed. A first plurality of balanced subgraphs based on the plurality of SWCCs, and a second plurality of balanced subgraphs based on the plurality of LWCCs, where each balanced subgraph of the first and second plurality of balanced subgraphs can be simulated using a simulator with a processing capacity less than or equal to a memory limit are generated. The first and the second plurality of balanced subgraphs are simulated.

20 Claims, 6 Drawing Sheets

PARTITIONING A CIRCUIT FOR DISTRIBUTED BALANCED INDEPENDENT SIMULATION JOBS WITH UPPER-BOUNDED MEMORY

RELATED APPLICATION

This application claims the benefit of U.S. Provisional Patent Appl. No. 63/228,355, filed Aug. 2, 2021, and entitled "PARTITIONING A CIRCUIT FOR DISTRIBUTED BALANCED INDEPENDENT SIMULATION JOBS WITH UPPER-BOUNDED MEMORY," and is incorporated herein in its entirety.

TECHNICAL FIELD

The present disclosure relates to the field of integrated circuit (IC) design and electronic design automation (EDA, and more particularly to a system and method for partitioning large circuits into balanced portions for independent simulation.

BACKGROUND

Circuit designers rely heavily on simulating their design to, for example, verify the correctness or for power analysis. Simulating a circuit is a computationally intensive task. The larger the circuit and/or the more cycles to simulate, the longer the simulation takes. Also, the memory footprint needed by a simulation is generally significant when reconstructing waveforms from the values of signals sampled by an emulator and may exceed the available memory.

SUMMARY

Some aspects of this disclosure relate to a method for partitioning large circuits into balanced portions for independent simulation jobs. For example, some aspects of this disclosure relate to a method, including, generating a reduced graph by removing startpoint vertices from a graph corresponding to a circuit. According to some aspects, the method further includes computing small weakly connected components (SWCCs) and large weakly connected components (LWCCs) corresponding to the reduced graph, where each SWCC of the plurality of SWCCs corresponds to a weakly connected component (WCC) of the reduced graph with a size less than or equal to a memory limit, and each LWCC of the plurality of LWCCs corresponds to a WCC of the reduced graph with a size greater than the memory limit. According to some aspects, the method further includes generating a first set of balanced subgraphs based on the plurality of SWCCs, and generating a second set of balanced subgraphs based on the LWCCs, where each balanced subgraph of the first and second sets of balanced subgraphs are configured to be simulated using a simulator with a processing capacity less than or equal to the memory limit.

Some aspects of this disclosure relate to the method that further includes clustering two or more SWCCs of the plurality of SWCCs into a balanced subgraph of the first set of balanced subgraphs using a greedy algorithm, where the greedy algorithm clusters the two or more SWCCs such that the number of startpoint vertices shared between the clustered SWCCs is maximized. According to some aspects, the method further includes sorting a plurality of endpoint vertices corresponding to an LWCC of the plurality of LWCCs in descending order of their respective heights and generating a balanced subgraph of the second set of balanced subgraphs by merging transitive fanins (TFIs) corresponding to two or more endpoint vertices of the sorted plurality of endpoint vertices using a greedy algorithm, where the greedy algorithm merges TFIs corresponding to the two or more endpoint vertices such that an overlap between the merged TFIs is maximized. According to some aspects, the plurality of startpoint vertices is selected based on the semantics of a simulator. According to some aspects, the first and the second sets of balanced subgraphs are simulated by the simulator. According to some aspects, the first and the second sets of balanced subgraphs are simulated independently using a plurality of simulators.

Some aspects of this disclosure relate to a system for partitioning large circuits into balanced portions for independent simulation jobs. For example, some aspects of this disclosure relate to a memory storing instructions, and a processor, coupled with the memory and to execute the instructions. According to some aspects, the instructions, when executed, cause the processor to generate a reduced graph by removing startpoint vertices from a graph corresponding to a circuit. According to some aspects, the instructions when executed, further cause the processor to compute small weakly connected components (SWCCs) and large weakly connected components (LWCCs) corresponding to the reduced graph, where each SWCC of the plurality of SWCCs corresponds to a weakly connected component (WCC) of the reduced graph with a size less than or equal to a memory limit, and each LWCC of the plurality of LWCCs corresponds to a WCC of the reduced graph with a size greater than the memory limit. According to some aspects, the instructions when executed, further cause the processor to generate a first set of balanced subgraphs based on the plurality of SWCCs, and generate a second set of balanced subgraphs based on the LWCCs, where each balanced subgraph of the first and second sets of balanced subgraphs are configured to be simulated using a simulator with a processing capacity less than or equal to the memory limit.

According to some aspects, to generate the first set of balanced subgraphs, the instructions when executed, further cause the processor to cluster two or more SWCCs of the plurality of SWCCs into a balanced subgraph of the first set of balanced subgraphs using a greedy algorithm, where the greedy algorithm clusters the two or more SWCCs such that a number of startpoint vertices shared between the clustered SWCCs is maximized. According to some aspects, to generate the second set of balanced subgraphs, the instructions when executed, further cause the processor to sort a plurality of endpoint vertices corresponding to a LWCC of the plurality of LWCCs in a descending order of their respective heights and generate a balanced subgraph of the second set of balanced subgraphs by merging transitive fanins (TFIs) corresponding to two or more endpoint vertices of the sorted plurality of endpoint vertices using a greedy algorithm, where the greedy algorithm merges TFIs corresponding to the two or more endpoint vertices such that an overlap between the merged TFIs is maximized.

Some aspects of this disclosure relate to a non-transitory computer readable medium, including stored instructions, which, when executed by a processor, cause the processor to generate a reduced graph by removing a plurality of startpoint vertices from a graph corresponding to a circuit. According to some aspects, the instructions further cause the processor to compute small weakly connected components (SWCCs) and large weakly connected components (LWCCs) corresponding to the reduced graph, where each SWCC of the plurality of SWCCs corresponds to a weakly connected component (WCC) of the reduced graph with a size less than or equal to a memory limit, and each LWCC of the plurality of LWCCs corresponds to a WCC of the reduced graph with a size greater than the memory limit. According to some aspects, the instructions further cause the processor to generate a first set of balanced subgraphs based on the plurality of SWCCs and generate a second set of balanced subgraphs based on the plurality of LWCCs, where each balanced subgraph of the first and second sets of balanced subgraphs are configured to be simulated using a simulator with a processing capacity less than or equal to the memory limit.

According to some aspects, to generate the first set of balanced subgraphs, the instructions further cause the processor to cluster two or more SWCCs of the plurality of SWCCs into a balanced subgraph of the first set of balanced subgraphs using a greedy algorithm, where the greedy algorithm clusters the two or more SWCCs such that the number of startpoint vertices shared between the clustered SWCCs is maximized. According to some aspects, to generate the second set of balanced subgraphs, the instructions further cause the processor to sort a plurality of endpoint vertices corresponding to an LWCC of the plurality of LWCCs in descending order of their respective heights and generate a balanced subgraph of the second set of balanced subgraphs by merging transitive fanins (TFIs) corresponding to two or more endpoint vertices of the sorted plurality of endpoint vertices using a greedy algorithm, where the greedy algorithm merges TFIs corresponding to the two or more endpoint vertices such that an overlap between the merged TFIs is maximized.

This Summary does not attempt to provide the complete significance of any particular innovation, embodiment, or example as it can be used in commerce. Additionally, this Summary is not intended to signify key or critical elements of an innovation, embodiment or example or to limit the scope of the subject matter of this disclosure. The innovations, embodiments, and/or examples found within this disclosure are not all-inclusive, but rather describe the basic significance of the subject matter. Accordingly, one use of this Summary is as a prelude to a Detailed Description presented below.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
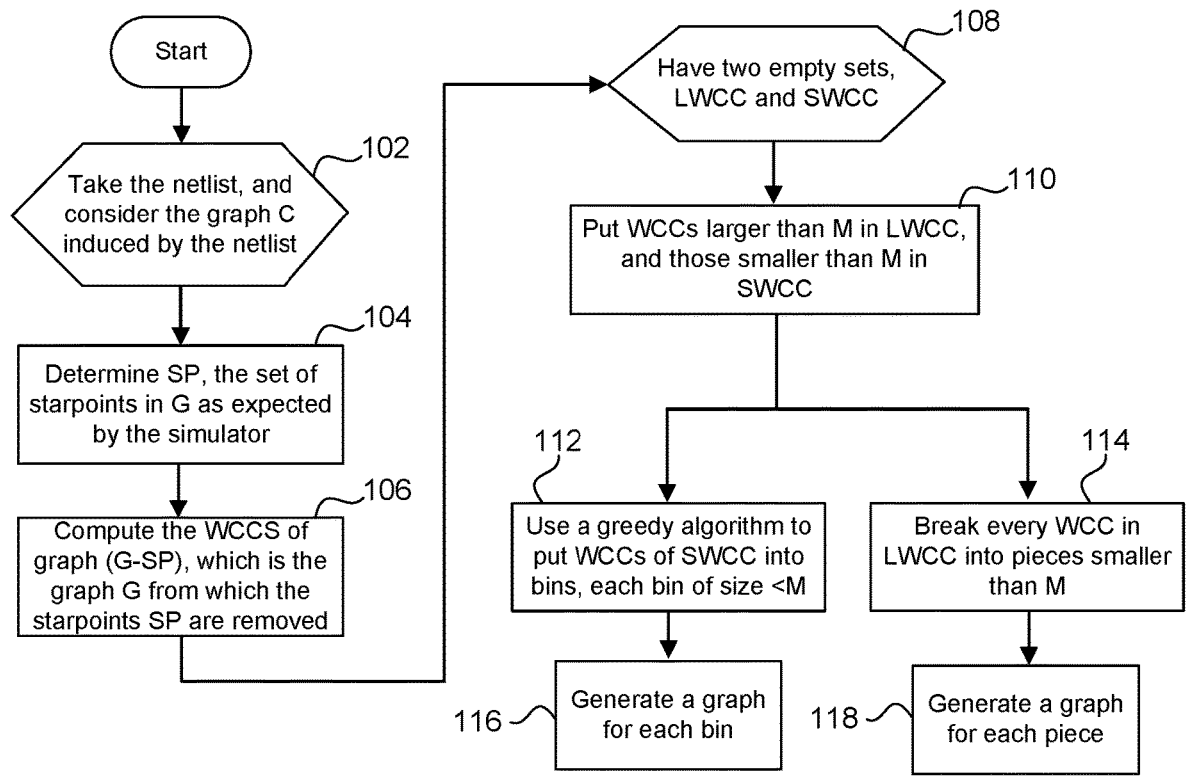
FIG. 1 illustrates an example method for partitioning a circuit into balanced subgraphs, according to some aspects of the disclosure.

Aspects of the present disclosure relate to a system and method to partition a circuit to distribute a simulation run of the circuit into balanced, independent jobs with an upper-bounded memory footprint.

Circuit designers rely on simulating their design, for example, to verify the circuit's correctness or for power analysis. Simulating a circuit is a computationally intensive task. The larger the circuit and/or the more cycles to simulate, the longer it takes. Also, the larger the circuit, the more memory it requires. Furthermore, a large memory requirement for simulation could result in a bottleneck since a simulation job cannot execute if the memory requirement is not met.

One or more embodiments of the present disclosure are directed towards a system and method that takes a circuit and divides the circuit into smaller, balanced circuit portions. Each circuit portion can be simulated independently from the others, with an upper bound on the memory footprint needed by simulation. According to some aspects, having an upper bound on the memory footprint needed by simulation is beneficial when reconstructing waveforms to avoid a memory bottleneck. For example, when using combinational or sequential simulation to reconstruct waveforms from the values of signals sampled by an emulator, the design may usually be very large with billions of elements, and accordingly, the memory footprint needed by the simulation would be very large as well.

According to some aspects, partitioning a circuit into balanced independent jobs with an upper-bounded memory footprint may bring two significant benefits. First, because the circuit portions are balanced in size and can be independently simulated, partitioning enables a massive, scalable job distribution of up to several thousands of jobs, which reduces the overall simulation time by a factor of up to 100, for example. Second, since each of the smaller pieces may be simulated with an upper bound on memory, machines on a grid may be utilized for a distributed simulation. Such distributed job processing may be performed on a cloud infrastructure having thousands of machines with relatively small memory.

Exemplary definitions relevant to some embodiments of the present disclosure are listed below:

According to some aspects, a directed graph G is a pair (V, E), where V is a set of vertices of the directed graph and E is a set of edges. The set of edges E is a subset of (V×V), which is the Cartesian product of the set V with itself.

According to some aspects, a subgraph of G is a graph G'=(V', E'), where V' is a set of vertices of the subgraph and E' is a set of edges, and V' is included in V, and E' is included in (V'×V') and E.

According to some aspects, a vertex $v_2$ is a successor of vertex $v_1$ if and only if $(v_1, v_2)$ is an edge. Alternatively, vertex $v_2$ is a successor of vertex $v_1$ when $v_2$ is in the fanout of $v_1$, and $v_1$ is in the fanin of $v_2$.

According to some aspects, vertex $v_b$ is said to be reachable from $v_a$ if and only if there is a sequence of edges $(v_i, v_{i+1})$, $0 \le i < n$, such that $v_0 = v_a$ and $v_n = v_b$, and the sequence of edges is called the path from $v_a$ to $v_b$.

According to some aspects, an undirected graph (V, E) has edges that are not directional, and an edge (u, v) of the undirected graph can be traversed in both directions.

According to some aspects, two vertices $v_1$ and $v_2$ of a graph G are weakly connected if vertex $v_2$ can be reached from $v_1$ using both the fanin and fanout relations. Accordingly, both directions of the edges may be used to establish a path from $v_1$ to $v_2$, which is equivalent to the paths in an undirected graph induced by G. According to some aspects, being weakly connected is an equivalence relation (i.e., it is symmetric, reflexive, and transitive), and the induced subgraphs of its equivalence classes are called weakly connected components (WCCs).

According to some aspects, the transitive fanin of a vertex v, denoted as TFI(v), is the transitive closure of the fanin relation starting from v. Accordingly, TFI(v) is the set of all vertices that may be reached from v using only the fanin relation.

According to some aspects, a netlist represents a circuit and is made of cells and nets. A cell has input ports and output ports. A net has a set of ports and connects output ports to input ports of one or more cells. Typically, a net may have a single output port. A cell $c_1$ is said to be in the fanin of cell $c_2$, and respectively, $c_2$ is in the fanout of $c_1$, if and only if there is a net that connects an output port of $c_1$ to an input port of $c_2$.

According to some aspects, a netlist is a directed graph (V, E) where V is the set of cells, and E includes a set of edges $(v_1, v_2)$, such that there is a net that connects an output port of cell $v_1$ to an input port of cell $v_2$.

According to some aspects, a simulator may generate a graph G corresponding to a circuit. According to some aspects, a simulator may be processing device 602 of computer system 600. To compute the value of a vertex v of the graph, the simulator may compute the values of vertex v's fanin, and combine the fanin values to produce vertex v's outputs, which in turn may be used to compute v's fanout values. According to some aspects, a vertex that is fanin-free may be referred to as a startpoint vertex, and a vertex that is fanout-free may be referred to as an endpoint vertex. According to some aspects, the value of a startpoint may be given by the nature of the cell (e.g., a constant), or may be provided as input to the simulator (e.g., a primary input, which is a signal that comes from outside of the circuit and therefore that cannot be simulated).

According to some aspects, a graph may include a cycle when a cell's value depends on its own value. Such circular dependency may be resolved by either performing a fixpoint computation or by forcing the emulator to sample the cell's output so that it becomes a primary input to the simulator (i.e., a startpoint vertex). According to some aspects, forcing a cell to become a startpoint may involve removing its incoming edges, which may create new endpoints.

According to some aspects, forcing a startpoint in the circuit may increase the number of WCCs in the graph. According to some aspects, for a combinational simulation every sequential cell output (i.e., registers and memories) is a startpoint. Thus, a graph for combinational simulation may have many more WCCs that a graph used by a sequential simulation.

According to some aspects, the memory to simulate graph G is in the order of O(|G|), where |G| indicates the number of elements in graph G. According to some aspects, to simplify the notation, it may be assumed without loss of generality that the memory is normalized so that the memory to simulate graph G is given by |G|.

FIG. 1 illustrates an example method for partitioning a circuit into balanced subgraphs, according to some aspects of the disclosure. FIG. 1 may be described with regard to elements of FIGS. 4-6. Method 100 may be performed by host system 507 of FIG. 5 or computer system 600 of FIG. 6. Method 100 is not limited to the specific aspects depicted in those figures, and other systems may be used to perform the method as will be understood by those skilled in the art. It is to be appreciated that not all operations may be needed, and the operations may not be performed in the same order as shown in FIG. 1.

At 102, a graph C induced by a netlist corresponding to a circuit is determined, according to some aspects. According to some aspects, the graph corresponding to the netlist may be a directed graph.

At 104, a graph G for the simulator is determined, according to some aspects. According to some aspects, graph G may be generated from a circuit graph C by forcing some of the cells of C to be startpoint vertices depending on the semantics of the simulator. According to some aspects, the set of vertices that is selected to be transformed into startpoints may depend on the semantics of a simulator (e.g., based on whether the simulation is combinational or sequential). According to some aspects, the set of startpoint vertices may be denoted by the set SP.

At 106, the set of startpoint vertices SP are removed from the set of vertices of graph G to obtain a reduced graph (G−SP), according to some aspects. Since the startpoints are fanin-free, the graph (G−SP) may have the same set of endpoints as the graph G, according to some aspects. At 106, weakly connected components (WCCs) of graph (G−SP) may be computed. According to some aspects, a WCC of (G−SP) can be simulated independently from the others, since it only needs the values of its startpoint, which are given as input to the simulator. Also, because no cell (i.e., vertex) is shared between two different WCCs, independent simulation of WCCs ensures that each cell is simulated only by the unique WCC that contains it, and therefore there is no redundant simulation.

At 108, a set of large weakly connected components (LWCC) and a set of small weakly connected components (SWCC) are defined, according to some aspects. The set of LWCC and the set of SWCC are defined based on a memory limit value M, that may be provided by a user. According to some aspects, the memory limit M represents a memory (e.g., a maximum memory) that may be taken to simulate each balanced subgraph obtained by the partitioning process.

At 110, the WCCs calculated at 106 are sorted based on their size, according to some aspects. If the size of a WCC is greater than the memory limit M, it may be placed in the set of LWCCs, i.e., LWCC={W∈WCC||W|>M}. Similarly, if the size of a WCC is smaller than the memory limit M, it may be placed in the set of SWCCs, i.e., SWCC={W∈WCC||W|≤M}.

At 112, a greedy algorithm may be used to place WCCs of the set of SWCCs into bins of size less than the memory limit M, according to some aspects. According to some aspects, because the elements of SWCC do not share any cell, the size of a bin is the sum of the size of its elements plus the desired startpoints. According to some aspects, because the elements of SWCC do not share any cell, there is no redundant simulation for cells in the SWCCs. According to some aspects, the greedy algorithm puts small WCCs into bins of capacity M such that the small WCCs within each bin share as many startpoints as possible and may keep an even distribution of bin capacity. According to some aspects, a greedy algorithm may minimize the number of bins into which the small WCCs are placed. According to some aspects, a greedy algorithm may be a bin-packing algorithm (e.g., Next-Fit, Next-k-Fit, Best-Fit, etc.).

At 114, each WCC in set of LWCCs is broken into smaller portions such that the size of each smaller portion is smaller than the memory limit M At 116, one or more balanced subgraphs corresponding to the set of SWCCs are generated, according to some aspects. The size of each balanced subgraph, obtained by clustering two or more SWCCs, is smaller than the memory limit M, according to some aspects.

At 118, one or more balanced subgraphs corresponding to the set of LWCCs are generated, according to some aspects. The size of each balanced subgraph, obtained by dividing a LWCC, is smaller than the memory limit M, according to some aspects.

Figure 2:
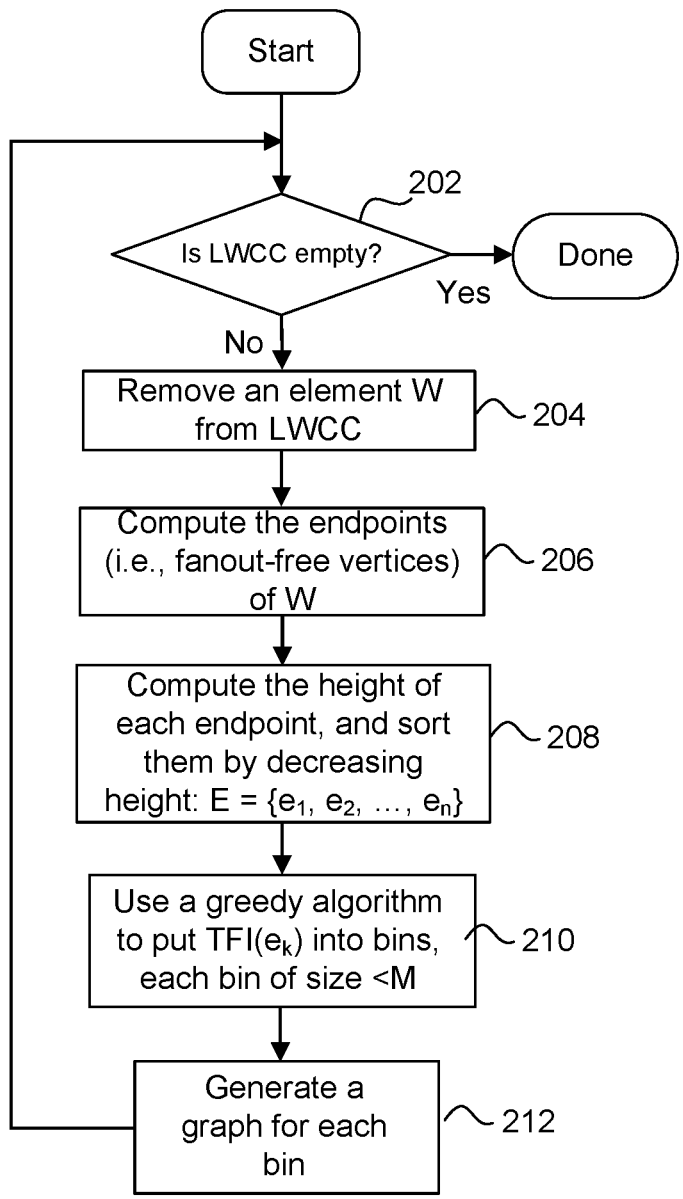
FIG. 2 illustrates an example method for dividing a large weakly connected component into smaller components, according to some aspects of the disclosure.

FIG. 2 illustrates an example method for dividing a LWCC into smaller components, according to some aspects of the disclosure. According to some aspects, 114 and 118 of FIG. 1 may be implemented using method 200. FIG. 2 may be described with regard to elements of FIGS. 4-6. Method 200 may be performed by host system 507 of FIG. 5 or computer system 600 of FIG. 6. Method 200 is not limited to the specific aspects depicted in those figures, and other systems may be used to perform the method as will be understood by those skilled in the art. It is to be appreciated that not all operations may be needed, and the operations may not be performed in the same order as shown in FIG. 2.

At 202, unprocessed LWCCs remaining in the set of LWCCs may be determined. According to some aspect, when unprocessed LWCCs are left in the set (i.e., the set of LWCCs is not empty), an LWCC from the set is removed for further processing at 204.

At 204, an element W is selected from the set of LWCCs, according to some aspects. The size of W is greater than the memory limit M since W is LWCC. According to some aspects, W may be selected in a random order from the set of LWCCs.

At 206, the set of endpoint vertices of W are computed, according to some aspects. According to some aspects, each endpoint is a fanout-free vertex of W. The set of ordered endpoints may be denoted as $E=\{e_1, e_2, \ldots, e_n\}$. According to some aspects, an endpoint $e_k$ in W may be simulated by a subgraph H when H includes the transitive fanin of $e_k$, $TFI(e_k)$.

According to some aspects, if the TFI of an endpoint $e_k$ is such that $|TFI(e_k)|>M$, it may not be possible to generate a job that could simulates $e_k$ with a peak memory lesser than M. However, the size of transitive fanin of an endpoint being larger than memory limit M may not happen with a combinational simulator because the largest TFIs encountered in circuits are typically no more than 10,000 cells, with is well below any reasonable upper bound on memory, according to some aspects. However, according to some aspects, when performing sequential simulation, the TFI can be much larger, and in such a case, the compiler to the emulator inserts startpoints to create smaller WCCs.

According to some aspects, a cell in W that is not an endpoint may necessarily be in the TFI of one or several endpoints. Hence, if a set of subgraphs of W that can simulate E are generated, then all the cells of W would necessarily be simulated. Hence, breaking down W for independent simulation may be performed using TFIs of its endpoints.

At 208, the set of endpoint vertices of W are ordered in the decreasing order of their heights. According to some aspects, the height of an endpoint $e_k$ is defined as the longest (directed, cycle-free) path from $e_k$ to a startpoint.

At 210, a greedy algorithm is used to cluster the TFIs of the endpoints into bins of size less than the memory limit M, according to some aspects. According to some aspects, heuristics provide that the size of TFI of an endpoint is proportional to the height of the endpoint. Accordingly, the higher an endpoint is, the larger its TFI would be. According to some aspects, starting with endpoints with the greatest heights, the TFIs of the endpoints are clustered into bins with a capacity less than M using a greedy algorithm. According to some aspects, the greedy algorithm clusters the TFIs such that the TFIs will overlap so as to maximize the number of endpoints whose TFIs can fit within the capacity M, thus reducing the number of bins necessary to break down the original graph W.

At 212, a subgraph corresponding to each bin is generated, according to some aspects. The subgraphs resulting from the union of TFIs of one or more end points may have a size less than the memory limit M. The clustering process may be repeated until all endpoints are processed. According to some aspects, method 200 may terminate once all LWCCs are have been processed to generate the balanced subgraphs.

According to some aspects, method 200 produces balanced subgraphs that could be simulated using independent simulation jobs. According to some aspects, implementing method 200 may result in having the same cell being simulated in several bins. However, since method 200 attempts to minimizing the number of bins, the amount of redundant computation is reduced, i.e., the number of simulation jobs is reduced.

Figure 3:
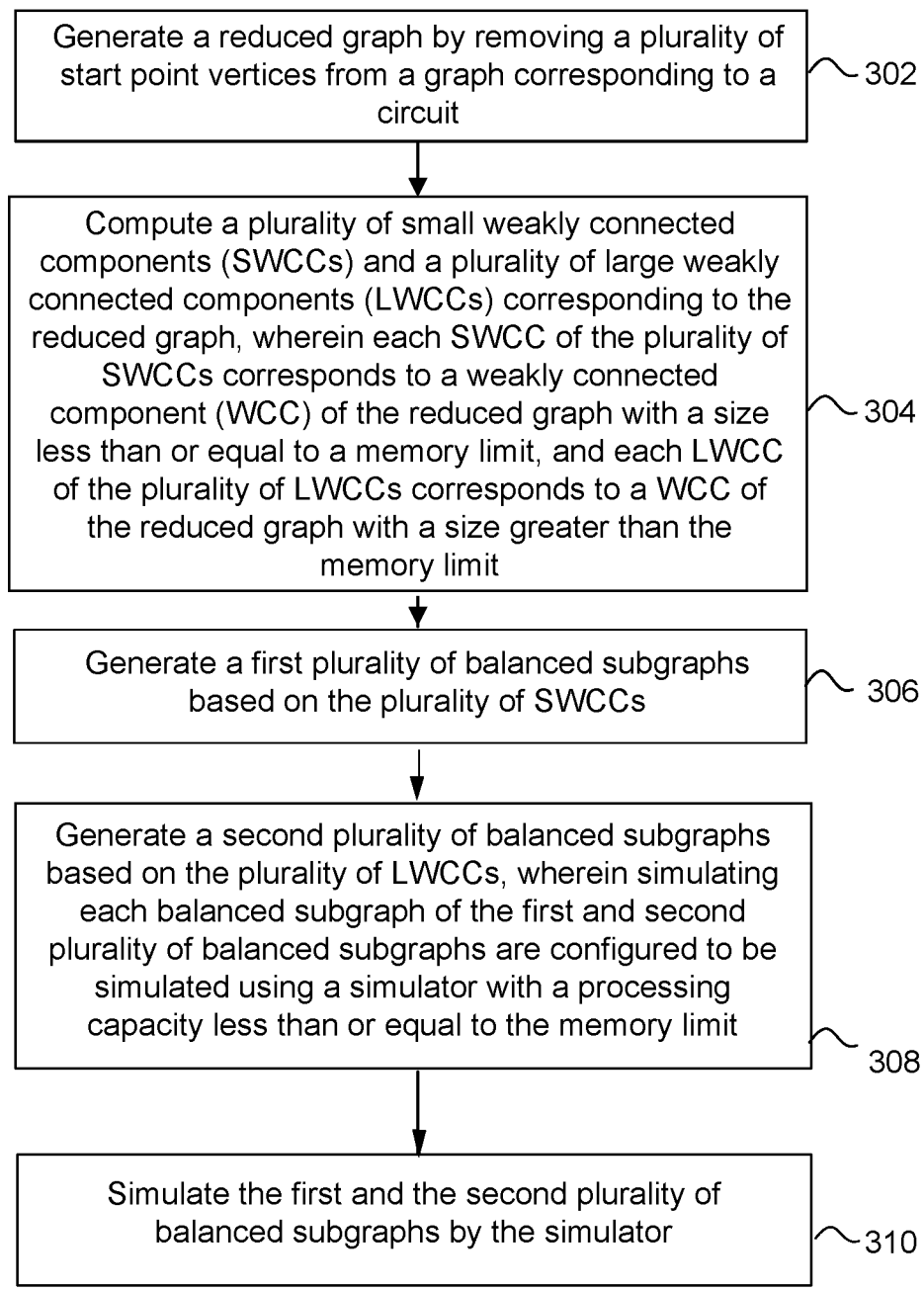
FIG. 3 illustrates an example method for generating balanced subgraphs, according to some aspects of the disclosure.

FIG. 3 illustrates an example method for generating balanced subgraphs, according to some aspects of the disclosure. FIG. 3 may be described with regard to elements of FIGS. 4-6. Method 300 may be performed by host system 507 of FIG. 5 or computer system 600 of FIG. 6. Method 300 is not limited to the specific aspects depicted in those figures, and other systems may be used to perform the method as will be understood by those skilled in the art. It is to be appreciated that not all operations may be needed, and the operations may not be performed in the same order as shown in FIG. 3.

At 302, a reduced graph may be generated by removing a plurality of startpoint vertices from a graph corresponding to a circuit, according to some aspects. According to some aspects, the plurality of startpoint vertices is selected based on semantics of a simulator (e.g., based on whether the simulation is combinational or sequential).

At 304, a plurality of small weakly connected components (SWCCs) and a plurality of large weakly connected components (LWCCs) corresponding to the reduced graph are computed, according to some aspects. According to some aspects, each SWCC of the plurality of SWCCs corresponds to a weakly connected component (WCC) of the reduced graph with a size less than or equal to a memory limit. According to some aspects, each LWCC of the plurality of LWCCs corresponds to a WCC of the reduced graph with a size greater than the memory limit.

At 306, a first plurality of balanced subgraphs is generated based on the plurality of SWCCs, according to some aspects. According to some aspects, the first plurality of balanced subgraphs is generated by clustering two or more SWCCs of the plurality of SWCCs into a balanced subgraph of the first plurality of balanced subgraphs using a greedy algorithm. According to some aspects, the greedy algorithm clusters the two or more SWCCs such that a number of startpoint vertices shared between the clustered SWCCs is maximized.

At 308, a second plurality of balanced subgraphs are generated based on the plurality of LWCCs, according to some aspects. According to some aspects, the second plurality of balanced subgraphs are generated by sorting a plurality of endpoint vertices corresponding to a LWCC of the plurality of LWCCs in a descending order of their respective heights, and generating a balanced subgraph of the second plurality of balanced subgraphs by merging transitive fanins (TFIs) corresponding to two or more endpoint vertices of the sorted plurality of endpoint vertices using a greedy algorithm. According to some aspects, the greedy algorithm merges TFIs corresponding to the two or more endpoint vertices such that an overlap between the merged TFIs is maximized. According to some aspects, a greedy algorithm may minimize the number of balanced subgraphs that are generated. According to some aspects, a greedy algorithm may be a bin-packing algorithm (e.g., Next-Fit, Next-k-Fit, Best-Fit, etc.).

According to some aspects, each balanced subgraph of the first plurality and second plurality of balanced subgraphs has a size that is less than the memory limit. Hence, each balanced subgraph may be simulated using a simulator with a processing capacity less than or equal to the memory limit.

At 310, the first and the second plurality of balanced subgraphs may be simulated independently using a plurality of simulators, according to some aspects. According to some aspects, the first and the second plurality of balanced subgraphs may be simulated in a distributed manner on a cloud infrastructure.

Figure 4:
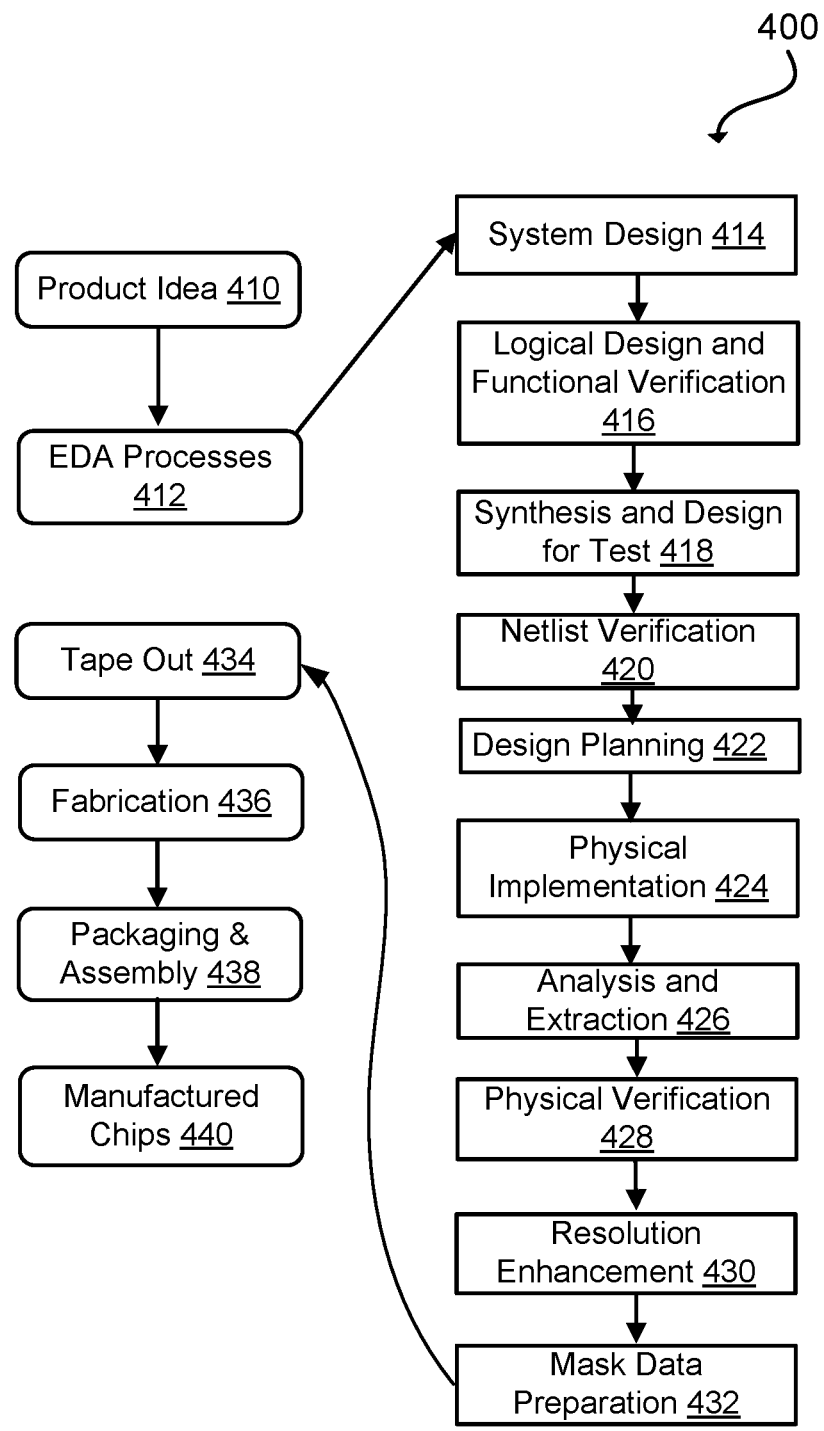
FIG. 4 depicts a flowchart of various processes used during the design and manufacture of an integrated circuit, according to some aspects of the disclosure.

FIG. 4 illustrates an example set of processes 400 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 410 with information supplied by a designer, information which is transformed to create an article of manufacture that uses a set of EDA processes 412. When the design is finalized, the design is taped-out 434, which is when artwork (e.g., geometric patterns) for the integrated circuit is sent to a fabrication facility to manufacture the mask set, which is then used to manufacture the integrated circuit. After tape-out, a semiconductor die is fabricated 436 and packaging and assembly processes 438 are performed to produce the finished integrated circuit 440.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding tools of that layer (e.g., a formal verification tool).

The set of processes in FIG. 4 may use the flows depicted in FIG. 1 and/or FIG. 2. For example, the flows described in FIG. 1 and FIG. 2 may be enabled/executed by EDA products (or tools). These EDA products (or tools) are examples of software applications that may be involved in or utilize the systems and processes depicted in FIGS. 1-6, discussed above.

During system design 414, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 416, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 418, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 420, the netlist is checked for compliance with timing constraints and for correspondence with the HDL code. During design planning 422, an overall floor plan for the integrated circuit is constructed and analyzed for timing and top-level routing.

During layout or physical implementation 424, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 426, the circuit function is verified at the layout level, which permits refinement of the layout design. During physical verification 428, the layout design is checked to ensure that manufacturing constraints are correct, such as DRC constraints, electrical constraints, lithographic constraints, and that circuitry function matches the HDL design specification. During resolution enhancement 430, the geometry of the layout is transformed to improve how the circuit design is manufactured.

During tape-out, data is created to be used (after lithographic enhancements are applied if appropriate) for production of lithography masks. During mask data preparation 432, the 'tape-out' data is used to produce lithography masks that are used to produce finished integrated circuits.

A storage subsystem of a computer system (such as computer system 600 of FIG. 6 or host system 507 of FIG. 5) may be used to store the programs and data structures that are used by some or all of the EDA products described herein, and products used for development of cells for the library and for physical and logical design that use the library.

Figure 5:
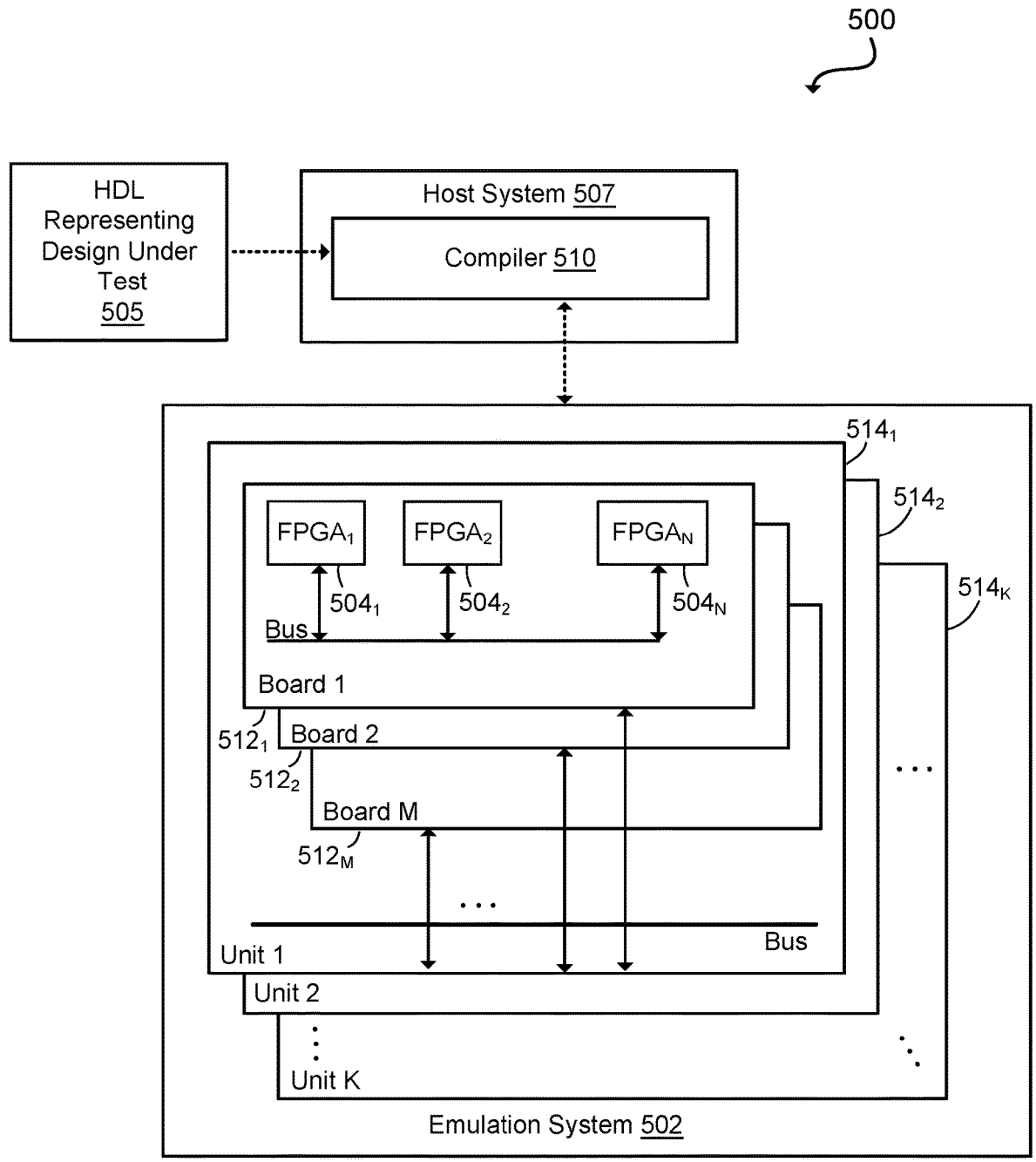
FIG. 5 depicts a diagram of an example emulation system in accordance with some embodiments of the present disclosure.

FIG. 5 depicts a diagram of an example emulation environment 500. An emulation environment 500 may be configured to verify the functionality of the circuit design. The emulation environment 500 may include a host system 507 (e.g., a computer that is part of an EDA system) and an emulation system 502 (e.g., a set of programmable devices such as Field Programmable Gate Arrays (FPGAs) or processors). The host system generates data and information by using a compiler 510 to structure the emulation system to emulate a circuit design. A circuit design to be emulated is also referred to as a Design Under Test ('DUT') where data and information from the emulation are used to verify the functionality of the DUT.

The host system 507 may include one or more processors. In the embodiment where the host system includes multiple processors, the functions described herein as being performed by the host system can be distributed among the multiple processors. The host system 507 may include a compiler 510 to transform specifications written in a description language that represents a DUT and to produce data (e.g., binary data) and information that is used to structure the emulation system 502 to emulate the DUT. The compiler 510 can transform, change, restructure, add new functions to, and/or control the timing of the DUT.

The host system 507 and emulation system 502 exchange data and information using signals carried by an emulation connection. The connection can be, but is not limited to, one or more electrical cables such as cables with pin structures compatible with the Recommended Standard 232 (RS232) or universal serial bus (USB) protocols. The connection can be a wired communication medium or network such as a local area network or a wide area network such as the Internet. The connection can be a wireless communication medium or a network with one or more points of access using a wireless protocol such as BLUETOOTH or IEEE 802.11. The host system 507 and emulation system 502 can exchange data and information through a third device such as a network server.

The emulation system 502 includes multiple FPGAs (or other modules) such as FPGAs $504_1$ and $504_2$ as well as additional FPGAs to $504_N$. Each FPGA can include one or more FPGA interfaces through which the FPGA is connected to other FPGAs (and potentially other emulation components) for the FPGAs to exchange signals. An FPGA interface can be referred to as an input/output pin or an FPGA pad. While an emulator may include FPGAs, embodiments of emulators can include other types of logic blocks instead of, or along with, the FPGAs for emulating DUTs. For example, the emulation system 502 can include custom FPGAs, specialized ASICs for emulation or prototyping, memories, and input/output devices.

A programmable device can include an array of programmable logic blocks and a hierarchy of interconnections that can enable the programmable logic blocks to be interconnected according to the descriptions in the HDL code. Each of the programmable logic blocks can enable complex combinational functions or enable logic gates such as AND, and XOR logic blocks. In some embodiments, the logic blocks also can include memory elements/devices, which can be simple latches, flip-flops, or other blocks of memory. Depending on the length of the interconnections between different logic blocks, signals can arrive at input terminals of the logic blocks at different times and thus may be temporarily stored in the memory elements/devices.

FPGAs $504_1$-$504_N$ may be placed onto one or more boards $512_1$ and $512_2$ as well as additional boards through $512_M$. Multiple boards can be placed into an emulation unit $514_1$. The boards within an emulation unit can be connected using the backplane of the emulation unit or any other types of connections. In addition, multiple emulation units (e.g., $514_1$ and $514_2$ through $514_K$) can be connected to each other by cables or any other means to form a multi-emulation unit system.

For a DUT that is to be emulated, the host system 507 transmits one or more bit files to the emulation system 502. The bit files may specify a description of the DUT and may further specify partitions of the DUT created by the host system 507 with trace and injection logic, mappings of the partitions to the FPGAs of the emulator, and design constraints. Using the bit files, the emulator structures the FPGAs to perform the functions of the DUT. In some embodiments, one or more FPGAs of the emulators may have the trace and injection logic built into the silicon of the FPGA. In such an embodiment, the FPGAs may not be structured by the host system to emulate trace and injection logic.

The host system 507 receives a description of a DUT that is to be emulated. In some embodiments, the DUT description is in a description language (e.g., a register transfer language (RTL)). In some embodiments, the DUT description is in netlist level files or a mix of netlist level files and HDL files. If part of the DUT description or the entire DUT description is in an HDL, then the host system can synthesize the DUT description to create a gate level netlist using the DUT description. A host system can use the netlist of the DUT to partition the DUT into multiple partitions where one or more of the partitions include trace and injection logic. The trace and injection logic traces interface signals that are exchanged via the interfaces of an FPGA. Additionally, the trace and injection logic can inject traced interface signals into the logic of the FPGA. The host system maps each partition to an FPGA of the emulator. In some embodiments, the trace and injection logic is included in select partitions for a group of FPGAs. The trace and injection logic can be built into one or more of the FPGAs of an emulator. The host system can synthesize multiplexers to be mapped into the FPGAs. The multiplexers can be used by the trace and injection logic to inject interface signals into the DUT logic.

The host system creates bit files describing each partition of the DUT and the mapping of the partitions to the FPGAs. For partitions in which trace and injection logic are included, the bit files also describe the logic that is included. The bit files can include place and route information and design constraints. The host system stores the bit files and information describing which FPGAs are to emulate each component of the DUT (e.g., to which FPGAs each component is mapped).

Upon request, the host system transmits the bit files to the emulator. The host system signals the emulator to start the emulation of the DUT. During emulation of the DUT or at the end of the emulation, the host system receives emulation results from the emulator through the emulation connection. Emulation results are data and information generated by the emulator during the emulation of the DUT which include interface signals and states of interface signals that have been traced by the trace and injection logic of each FPGA. The host system can store the emulation results and/or transmits the emulation results to another processing system.

After emulation of the DUT, a circuit designer can request to debug a component of the DUT. If such a request is made, the circuit designer can specify a time period of the emulation to debug. The host system identifies which FPGAs are emulating the component using the stored information. The host system retrieves stored interface signals associated with the time period and traced by the trace and injection logic of each identified FPGA. The host system signals the emulator to re-emulate the identified FPGAs. The host system transmits the retrieved interface signals to the emulator to re-emulate the component for the specified time period. The trace and injection logic of each identified FPGA injects its respective interface signals received from the host system into the logic of the DUT mapped to the FPGA. In case of multiple re-emulations of an FPGA, merging the results produces a full debug view.

The host system receives, from the emulation system, signals traced by logic of the identified FPGAs during the re-emulation of the component. The host system stores the signals received from the emulator. The signals traced during the re-emulation can have a higher sampling rate than the sampling rate during the initial emulation. For example, in the initial emulation a traced signal can include a saved state of the component every X milliseconds. However, in the re-emulation the traced signal can include a saved state every Y milliseconds where Y is less than X. If the circuit designer requests to view a waveform of a signal traced during the re-emulation, the host system can retrieve the stored signal and display a plot of the signal. For example, the host system can generate a waveform of the signal. Afterwards, the circuit designer can request to re-emulate the same component for a different time period or to re-emulate another component.

A host system 507 and/or the compiler 510 may include sub-systems such as, but not limited to, a design synthesizer sub-system, a mapping sub-system, a run time sub-system, a results sub-system, a debug sub-system, a waveform sub-system, and a storage sub-system. The sub-systems can be structured and enabled as individual or multiple modules or two or more may be structured as a module. Together these sub-systems structure the emulator and monitor the emulation results.

The design synthesizer sub-system transforms the HDL that is representing a DUT 505 into gate level logic. For a DUT that is to be emulated, the design synthesizer sub-system receives a description of the DUT. If the description of the DUT is fully or partially in HDL (e.g., RTL or other level of representation), the design synthesizer sub-system synthesizes the HDL of the DUT to create a gate-level netlist with a description of the DUT in terms of gate level logic.

The mapping sub-system partitions DUTs and maps the partitions into emulator FPGAs. The mapping sub-system partitions a DUT at the gate level into a number of partitions using the netlist of the DUT. For each partition, the mapping sub-system retrieves a gate level description of the trace and injection logic and adds the logic to the partition. As described above, the trace and injection logic included in a partition is used to trace signals exchanged via the interfaces of an FPGA to which the partition is mapped (trace interface signals). The trace and injection logic can be added to the DUT prior to the partitioning. For example, the trace and injection logic can be added by the design synthesizer sub-system prior to or after the synthesizing the HDL of the DUT.

In addition to including the trace and injection logic, the mapping sub-system can include additional tracing logic in a partition to trace the states of certain DUT components that are not traced by the trace and injection. The mapping sub-system can include the additional tracing logic in the DUT prior to the partitioning or in partitions after the partitioning. The design synthesizer sub-system can include the additional tracing logic in an HDL description of the DUT prior to synthesizing the HDL description.

The mapping sub-system maps each partition of the DUT to an FPGA of the emulator. For partitioning and mapping, the mapping sub-system uses design rules, design constraints (e.g., timing or logic constraints), and information about the emulator. For components of the DUT, the mapping sub-system stores information in the storage sub-system describing which FPGAs are to emulate each component.

Using the partitioning and the mapping, the mapping sub-system generates one or more bit files that describe the created partitions and the mapping of logic to each FPGA of the emulator. The bit files can include additional information such as constraints of the DUT and routing information of connections between FPGAs and connections within each FPGA. The mapping sub-system can generate a bit file for each partition of the DUT and can store the bit file in the storage sub-system. Upon request from a circuit designer, the mapping sub-system transmits the bit files to the emulator, and the emulator can use the bit files to structure the FPGAs to emulate the DUT.

If the emulator includes specialized ASICs that include the trace and injection logic, the mapping sub-system can generate a specific structure that connects the specialized ASICs to the DUT. In some embodiments, the mapping sub-system can save the information of the traced/injected signal and where the information is stored on the specialized ASIC.

The run time sub-system controls emulations performed by the emulator. The run time sub-system can cause the emulator to start or stop executing an emulation. Additionally, the run time sub-system can provide input signals and data to the emulator. The input signals can be provided directly to the emulator through the connection or indirectly through other input signal devices. For example, the host system can control an input signal device to provide the input signals to the emulator. The input signal device can be, for example, a test board (directly or through cables), signal generator, another emulator, or another host system.

The results sub-system processes emulation results generated by the emulator. During emulation and/or after completing the emulation, the results sub-system receives emulation results from the emulator generated during the emulation. The emulation results include signals traced during the emulation. Specifically, the emulation results include interface signals traced by the trace and injection logic emulated by each FPGA and can include signals traced by additional logic included in the DUT. Each traced signal can span multiple cycles of the emulation. A traced signal includes multiple states and each state is associated with a time of the emulation. The results sub-system stores the traced signals in the storage sub-system. For each stored signal, the results sub-system can store information indicating which FPGA generated the traced signal.

The debug sub-system allows circuit designers to debug DUT components. After the emulator has emulated a DUT and the results sub-system has received the interface signals traced by the trace and injection logic during the emulation, a circuit designer can request to debug a component of the DUT by re-emulating the component for a specific time period. In a request to debug a component, the circuit designer identifies the component and indicates a time period of the emulation to debug. The circuit designer's request can include a sampling rate that indicates how often states of debugged components should be saved by logic that traces signals.

The debug sub-system identifies one or more FPGAs of the emulator that are emulating the component using the information stored by the mapping sub-system in the storage sub-system. For each identified FPGA, the debug sub-system retrieves, from the storage sub-system, interface signals traced by the trace and injection logic of the FPGA during the time period indicated by the circuit designer. For example, the debug sub-system retrieves states traced by the trace and injection logic that are associated with the time period.

The debug sub-system transmits the retrieved interface signals to the emulator. The debug sub-system instructs the debug sub-system to use the identified FPGAs and for the trace and injection logic of each identified FPGA to inject its respective traced signals into logic of the FPGA to re-emulate the component for the requested time period. The debug sub-system can further transmit the sampling rate provided by the circuit designer to the emulator so that the tracing logic traces states at the proper intervals.

To debug the component, the emulator can use the FPGAs to which the component has been mapped. Additionally, the re-emulation of the component can be performed at any point specified by the circuit designer.

For an identified FPGA, the debug sub-system can transmit instructions to the emulator to load multiple emulator FPGAs with the same configuration of the identified FPGA. The debug sub-system additionally signals the emulator to use the multiple FPGAs in parallel. Each FPGA from the multiple FPGAs is used with a different time window of the interface signals to generate a larger time window in a shorter amount of time. For example, the identified FPGA can require an hour or more to use a certain amount of cycles. However, if multiple FPGAs have the same data and structure of the identified FPGA and each of these FPGAs runs a subset of the cycles, the emulator can require a few minutes for the FPGAs to collectively use all the cycles.

A circuit designer can identify a hierarchy or a list of DUT signals to re-emulate. To enable this, the debug sub-system determines the FPGA needed to emulate the hierarchy or list of signals, retrieves the necessary interface signals, and transmits the retrieved interface signals to the emulator for re-emulation. Thus, a circuit designer can identify any element (e.g., component, device, or signal) of the DUT to debug/re-emulate.

The waveform sub-system generates waveforms using the traced signals. If a circuit designer requests to view a waveform of a signal traced during an emulation run, the host system retrieves the signal from the storage sub-system. The waveform sub-system displays a plot of the signal. For one or more signals, when the signals are received from the emulator, the waveform sub-system can automatically generate the plots of the signals.

Figure 6:
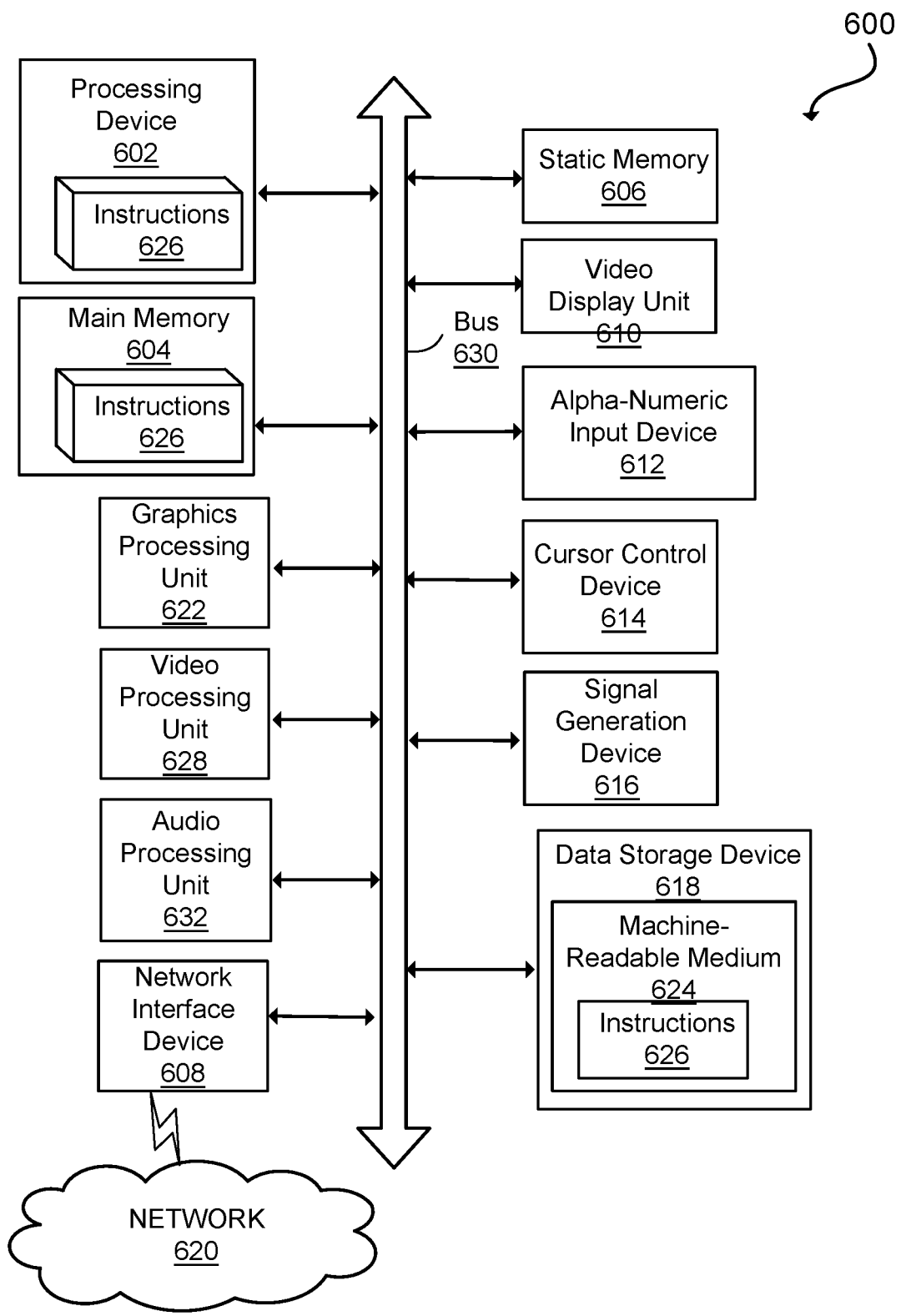
FIG. 6 depicts a diagram of an example computer system in which embodiments of the present disclosure may operate.

FIG. 6 illustrates an example machine of a computer system 600 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM), a static memory 606 (e.g., flash memory, static random access memory (SRAM), etc.), and a data storage device 614, which communicate with each other via a bus 630.

Processing device 602 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 may also be one or more special-purpose processing devices such as an application specific integrated circuit (ASIC), a field programmable gate array (FPGA), a digital signal processor (DSP), network processor, or the like. The processing device 602 may be configured to execute instructions 626 for performing the operations and steps described herein.

The computer system 600 may further include a network interface device 608 to communicate over the network 620. The computer system 600 also may include a video display unit 610 (e.g., a liquid crystal display (LCD) or a cathode ray tube (CRT)), an alphanumeric input device 612 (e.g., a keyboard), a cursor control device 614 (e.g., a mouse), a graphics processing unit 622, a signal generation device 616 (e.g., a speaker), graphics processing unit 622, video processing unit 628, and audio processing unit 632.

The data storage device 618 may include a machine-readable storage medium 624 (also known as a non-transitory computer-readable medium) on which is stored one or more sets of instructions 626 or software embodying any one or more of the methodologies or functions described herein. The instructions 626 may also reside, completely or at least partially, within the main memory 604 and/or within the processing device 602 during execution thereof by the computer system 600, the main memory 604 and the processing device 602 also constituting machine-readable storage media.

In some implementations, the instructions 626 include instructions to implement functionality corresponding to the present disclosure. While the machine-readable storage medium 624 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 602 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method, comprising:
generating a reduced graph by removing a plurality of startpoint vertices from a graph corresponding to a circuit;
computing a plurality of small weakly connected components (SWCCs) and a plurality of large weakly connected components (LWCCs) corresponding to the reduced graph, wherein each SWCC of the plurality of SWCCs corresponds to a weakly connected component (WCC) of the reduced graph with a size less than or equal to a memory limit, and wherein each LWCC of the plurality of LWCCs corresponds to a WCC of the reduced graph with a size greater than the memory limit;
generating a first plurality of balanced subgraphs based on the plurality of SWCCs; and
generating a second plurality of balanced subgraphs based on the plurality of LWCCs, wherein each balanced subgraph of the first and second plurality of balanced subgraphs are configured to be simulated using a simulator with a processing capacity less than or equal to the memory limit.

2. The method of claim 1, wherein generating the first plurality of balanced subgraphs further comprises:
clustering two or more SWCCs of the plurality of SWCCs into a balanced subgraph of the first plurality of balanced subgraphs using a greedy algorithm.

3. The method of claim 2, wherein the greedy algorithm clusters the two or more SWCCs such that a number of startpoint vertices shared between the clustered SWCCs is maximized.

4. The method of claim 1, wherein generating the second plurality of balanced subgraphs further comprises:
sorting a plurality of endpoint vertices of a LWCC of the plurality of LWCCs in a descending order of their respective heights; and
generating a balanced subgraph of the second plurality of balanced subgraphs by merging transitive fanins (TFIs) corresponding to two or more endpoint vertices of the sorted plurality of endpoint vertices using a greedy algorithm.

5. The method of claim 4, wherein the greedy algorithm merges TFIs corresponding to the two or more endpoint vertices such that an overlap between the merged TFIs is maximized.

6. The method of claim 1, wherein the plurality of startpoint vertices is selected based on semantics of a simulator.

7. The method of claim 1, wherein the first and the second plurality of balanced subgraphs are simulated by the simulator.

8. A system, comprising:
a memory storing instructions; and
a processor, coupled with the memory and to execute the instructions, the instructions when executed cause the processor to:
generate a reduced graph by removing a plurality of startpoint vertices from a graph corresponding to a circuit;
compute a plurality of small weakly connected components (SWCCs) and a plurality of large weakly connected components (LWCCs) corresponding to the reduced graph, wherein each SWCC of the plurality of SWCCs corresponds to a weakly connected component (WCC) of the reduced graph with a size less than or equal to a memory limit, and wherein each LWCC of the plurality of LWCCs corresponds to a WCC of the reduced graph with a size greater than the memory limit;
generate a first plurality of balanced subgraphs based on the plurality of SWCCs; and
generate a second plurality of balanced subgraphs based on the plurality of LWCCs, wherein each balanced subgraph of the first and second plurality of balanced subgraphs are configured to be simulated using a simulator with a processing capacity less than or equal to the memory limit.

9. The system of claim 8, wherein to generate the first plurality of balanced subgraphs, the processor is further configured to:
cluster two or more SWCCs of the plurality of SWCCs into a balanced subgraph of the first plurality of balanced subgraphs using a greedy algorithm.

10. The system of claim 9, wherein the greedy algorithm clusters the two or more SWCCs such that a number of startpoint vertices shared between the clustered SWCCs is maximized.

11. The system of claim 8, wherein to generate the second plurality of balanced subgraphs, the processor is further configured to:
sort a plurality of endpoint vertices of a LWCC of the plurality of LWCCs in a descending order of their respective heights; and
generate a balanced subgraph of the second plurality of balanced subgraphs by merging transitive fanins (TFIs) corresponding to two or more endpoint vertices of the sorted plurality of endpoint vertices using a greedy algorithm.

12. The system of claim 11, wherein the greedy algorithm merges TFIs corresponding to the two or more endpoint vertices such that an overlap between the merged TFIs is maximized.

13. The system of claim 8, wherein the plurality of startpoint vertices is selected based on semantics of a simulator.

14. The system of claim 8, wherein the first and the second plurality of balanced subgraphs are simulated by the simulator.

15. A non-transitory computer readable medium (CRM) comprising stored instructions, which when executed by a processor, cause the processor to:
generate a reduced graph by removing a plurality of startpoint vertices from a graph corresponding to a circuit;
compute a plurality of small weakly connected components (SWCCs) and a plurality of large weakly connected components (LWCCs) corresponding to the reduced graph, wherein each SWCC of the plurality of SWCCs corresponds to a weakly connected component (WCC) of the reduced graph with a size less than or equal to a memory limit, and wherein each LWCC of the plurality of LWCCs corresponds to a WCC of the reduced graph with a size greater than the memory limit;
generate a first plurality of balanced subgraphs based on the plurality of SWCCs; and
generate a second plurality of balanced subgraphs based on the plurality of LWCCs, wherein each balanced subgraph of the first and second plurality of balanced subgraphs are configured to be simulated using a simulator with a processing capacity less than or equal to the memory limit.

16. The non-transitory CRM of claim 15, wherein generating the first plurality of balanced subgraphs further comprises:
clustering two or more SWCCs of the plurality of SWCCs into a balanced subgraph of the first plurality of balanced subgraphs using a greedy algorithm.

17. The non-transitory CRM of claim 16, wherein the greedy algorithm clusters the two or more SWCCs such that a number of startpoint vertices shared between the clustered SWCCs is maximized.

18. The non-transitory CRM of claim 15, wherein to generate the second plurality of balanced subgraphs, the instructions further cause the processor to:
sort a plurality of endpoint vertices corresponding to a LWCC of the plurality of LWCCs in a descending order of their respective heights; and
generate a balanced subgraph of the second plurality of balanced subgraphs by merging transitive fanins (TFIs) corresponding to two or more endpoint vertices of the sorted plurality of endpoint vertices using a greedy algorithm.

19. The non-transitory CRM of claim 18, wherein the greedy algorithm merges TFIs corresponding to the two or more endpoint vertices such that an overlap between the merged TFIs is maximized.

20. The non-transitory CRM of claim 15, wherein the plurality of startpoint vertices is selected based on semantics of a simulator.

* * * * *